(12) United States Patent
Tang

(10) Patent No.: US 12,308,277 B2
(45) Date of Patent: May 20, 2025

(54) WAFER PROCESSING DEVICE AND WAFER CONVEYING METHOD

(71) Applicant: CHANGXIN MEMORY TECHNOLOGIES, INC., Hefei (CN)

(72) Inventor: Hui Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 715 days.

(21) Appl. No.: 17/502,149

(22) Filed: Oct. 15, 2021

(65) Prior Publication Data
US 2022/0102188 A1 Mar. 31, 2022

Related U.S. Application Data

(63) Continuation of application No. PCT/CN2021/106600, filed on Jul. 15, 2021.

(30) Foreign Application Priority Data

Sep. 25, 2020 (CN) .......................... 202011026688.2

(51) Int. Cl.
*H01L 21/687* (2006.01)
*H01L 21/67* (2006.01)

(52) U.S. Cl.
CPC .. *H01L 21/68742* (2013.01); *H01L 21/67253* (2013.01); *H01L 21/67259* (2013.01); *H01L 21/68792* (2013.01)

(58) Field of Classification Search
CPC ......... H01L 21/67253; H01L 21/67259; H01L 21/68742
See application file for complete search history.

(56) References Cited

U.S. PATENT DOCUMENTS

2005/0194100 A1 9/2005 Or
2019/0035671 A1 1/2019 Ha et al.
(Continued)

FOREIGN PATENT DOCUMENTS

CN 101692432 A 4/2010
CN 111564403 A 8/2020
(Continued)

OTHER PUBLICATIONS

English translation of TW 579069 U, Tu David et al., Substrate pedestal with lifting mechanism, Mar. 1, 2004. (Year: 2004).*

*Primary Examiner* — Eric A. Gates
(74) *Attorney, Agent, or Firm* — Kilpatrick Townsend & Stockton LLP

(57) ABSTRACT

A wafer processing device and a wafer conveying method are provided. The wafer processing device includes: a bearing plate provided with a through hole and configured to bear a wafer; a drive base liftable relative to the bearing plate; a lifting rod arranged between the bearing plate and the drive base, an end of the lifting rod being in contact with the drive base, and the drive base driving the lifting rod to ascend and descend in the through hole, so that an another end of the lifting rod acts on a bottom surface of the wafer through the through hole to separate the wafer from the bearing plate; an electromagnetic conversion device arranged on the drive base, which may generate magnetic force after being powered on; and a magnetic element arranged at the end, close to the drive base, of the lifting rod.

18 Claims, 12 Drawing Sheets

(56) References Cited

U.S. PATENT DOCUMENTS

| | | | |
|---|---|---|---|
| 2019/0057894 A1 | 2/2019 | Xu et al. | |
| 2020/0020566 A1* | 1/2020 | Inhofer | |
| 2020/0185260 A1* | 6/2020 | Malik | ............... H01L 21/67376 |
| 2022/0076987 A1* | 3/2022 | Eschenmoser | .... H01L 21/68742 |

FOREIGN PATENT DOCUMENTS

| | | | | |
|---|---|---|---|---|
| JP | H08316292 A | * | 11/1996 | |
| KR | 20000025768 A | * | 5/2000 | |
| KR | 20010090743 A | * | 10/2001 | |
| KR | 20080043994 A | * | 5/2008 | |
| KR | 20200018317 A | * | 2/2020 | |
| TW | 579069 U | | 3/2004 | |
| WO | WO-2020001751 A1 | * | 1/2020 | |
| WO | WO-2022062592 A1 | * | 3/2022 | ....... H01L 21/67253 |

* cited by examiner

WAFER PROCESSING DEVICE AND WAFER CONVEYING METHOD

CROSS-REFERENCE TO RELATED APPLICATIONS

This is a continuation application of International Patent Application No. PCT/CN2021/106600, filed on Jul. 15, 2021, which claims priority to Chinese Patent Application No. 202011026688.2, filed on Sep. 25, 2020 and entitled "Wafer Processing Device and Wafer Conveying Method". The disclosures of these applications are incorporated by reference herein in their entireties.

BACKGROUND

During semiconductor wafer processing, a wafer processing device is relatively complicated, including many different systems. Herein, the most important is a reaction chamber. The position of the wafer in the reaction chamber is realized by the lifting drive of a lifting rod. After the wafer processing is completed, the top end of the lifting rod abuts against the bottom surface of the wafer, to lift the wafer to a suitable position, so that a mechanical arm can accurately grab the wafer. However, the current lifting rod usually gets stuck after jacking up the wafer. When the next wafer is processed, the lifting rod is easy to collide with the wafer and thus is damaged.

SUMMARY

The disclosure relates to the technical field of semiconductor device preparation, in particular to a wafer processing device and a wafer conveying method.

According to a first aspect of the disclosure, there is provided a wafer processing device, which includes a bearing plate, a drive base, a lifting rod, an electromagnetic conversion device and a magnetic element. Herein, a through hole is formed in the bearing plate, and the bearing plate is configured to bear the wafer. The drive base is liftable relative to the bearing plate. The lifting rod is arranged between the bearing plate and the drive base. An end of the lifting rod is in contact with the drive base, and the drive base drives the lifting rod to ascend and descend in the through hole, so that an another end of the lifting rod acts on an bottom surface of the wafer through the through hole to separate the wafer from the bearing plate. The electromagnetic conversion device is arranged on the drive base, and the electromagnetic conversion device may generate a magnetic force after being powered on. The magnetic element is arranged at an end, close to the drive base, of the lifting rod. After the electromagnetic conversion device generates the magnetic force, the electromagnetic conversion device magnetically attracts the magnetic element, and when the drive base descends, a pulling force is applied to the lifting rod.

According to a second aspect of the disclosure, there is provided a wafer conveying method for conveying a wafer processed by the wafer processing device above mentioned. The wafer conveying method includes the following operations. The wafer is arranged on a bearing plate. A drive base drives a lifting rod to act on a bottom surface of the wafer, to place the wafer at a preset position. A pulling force is applied to the lifting rod, to separate the lifting rod from the bottom surface of the wafer.

BRIEF DESCRIPTION OF THE DRAWINGS

The exemplary embodiments are described in details with reference to the drawings, so that the above or other features and advantages of the disclosure become more apparent.

DETAILED DESCRIPTION

Figure 1:
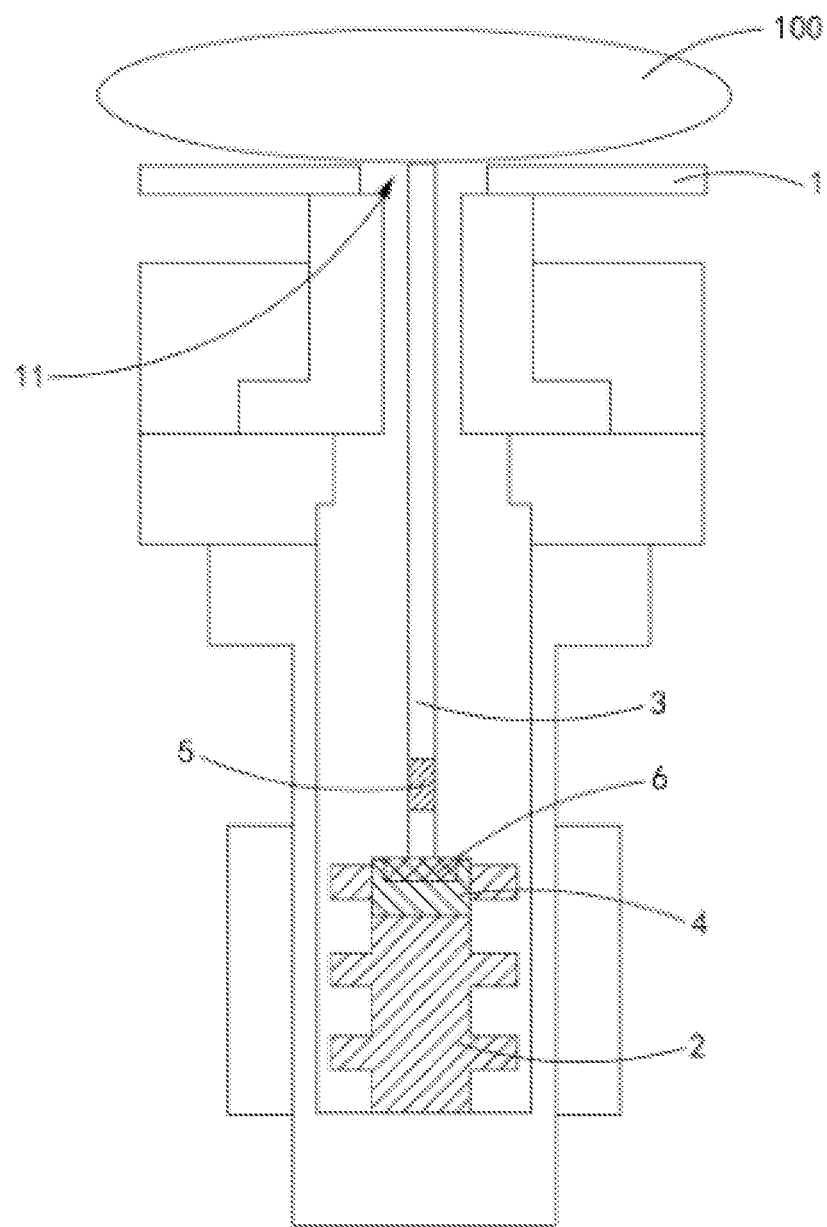
FIG. 1 is a schematic diagram illustrating that a wafer is not jacked up by a lifting rod in a wafer processing device according to one exemplary embodiment of the disclosure.

The exemplary implementation modes will now be described more fully with reference to the drawings. However, the exemplary implementation mode can be implemented in various forms and should not be understood to be limited to the implementation mode described herein. On the contrary, the provision of these implementation modes makes the disclosure more comprehensive and complete and fully communicates the idea of the exemplary implementation modes to those skilled in the art. The same reference numerals in the drawing indicate the same or similar structure, and thus their detailed description will be omitted.

Different exemplary implementation modes of the disclosure are described below with reference to the drawings. The drawings are a part of the disclosure, and show, in an example manner, different exemplary structures that may implement multiple aspects of the disclosure. It is understood that other specific solutions of parts, structures, exemplary devices, systems, and steps may be used, and the structural and functional modifications may be made without deviating from the scope of the disclosure. Although this specification may use terms such as "above", "between" and "within" to describe the different exemplary features and elements of the disclosure, these terms are used in this specification only for convenience, for example, according to the example directions in the drawings. Any content in this specification should be not understood as requiring a particular three-dimensional orientation of the structure to fall within the scope of the disclosure. In addition, terms "first" and "second" in claims are used only as signs, not as a limitation on the number of their objects.

Figure 9:
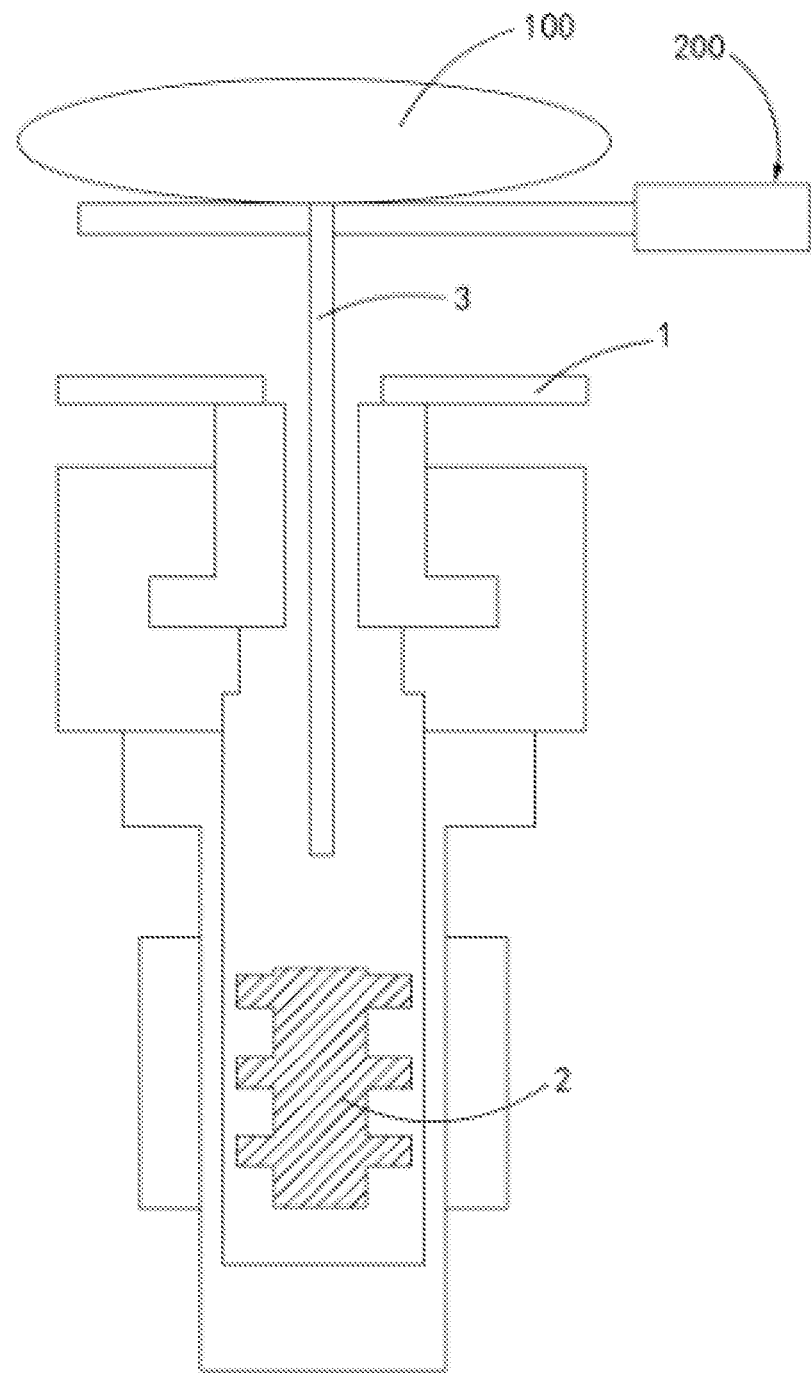
FIG. 9 is a schematic diagram illustrating that a lifting rod jacks up a wafer and is magnetically attracted at the bottom surface of the wafer in the related art.
Figure 10:
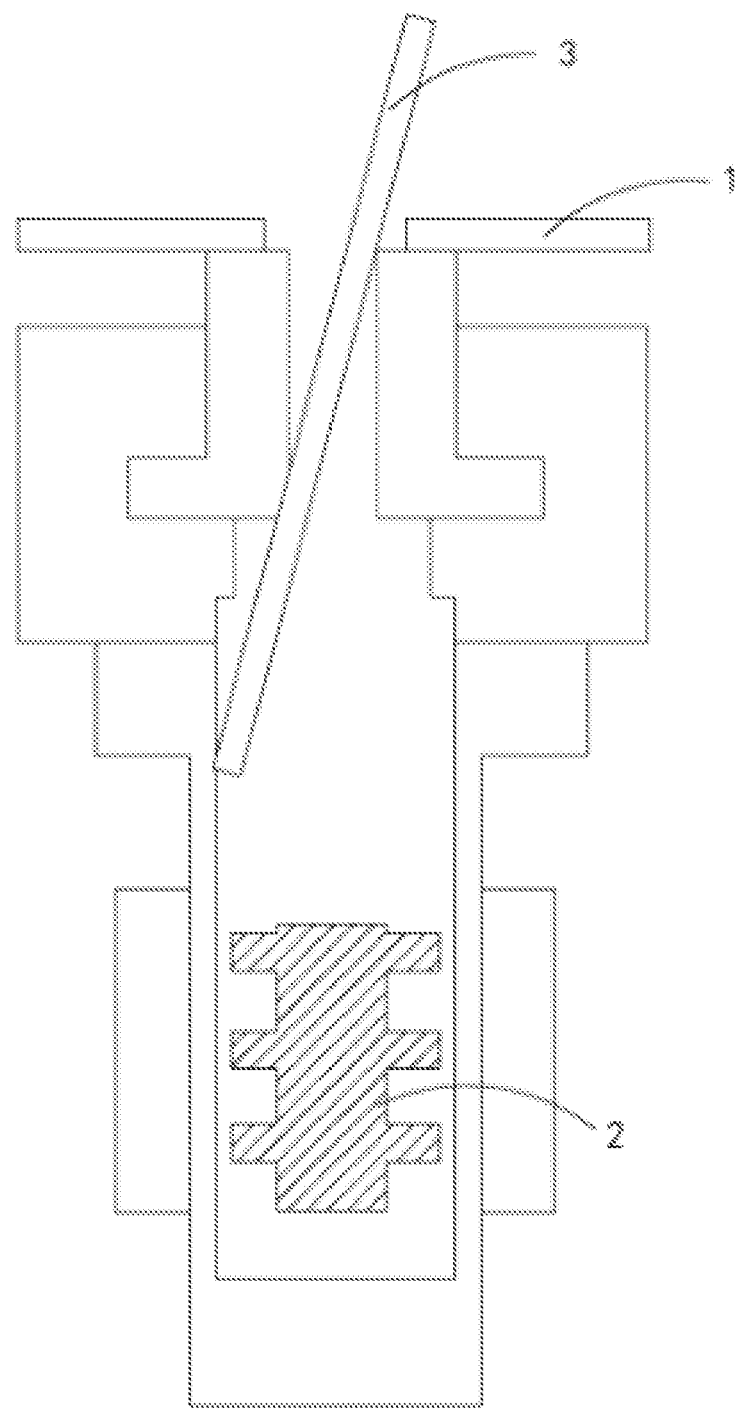
FIG. 10 is a state schematic diagram illustrating that a lifting rod is obliquely stuck in the related art.
Figure 11:
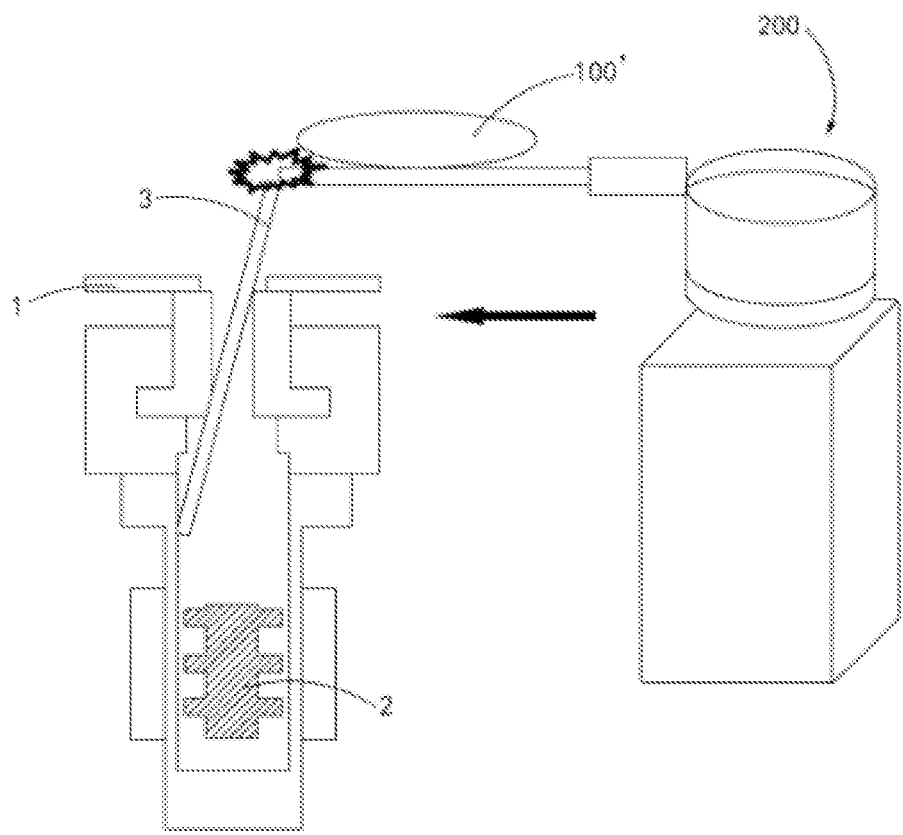
FIG. 11 is a state schematic diagram illustrating that a lifting rod collides with the next wafer in the related art.
Figure 12:
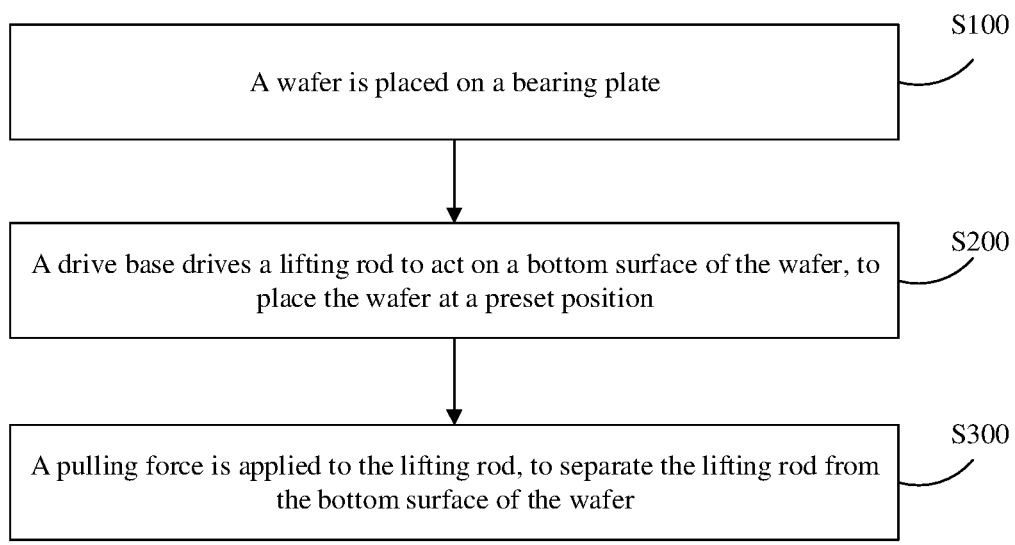
FIG. 12 is a schematic flow chart of a wafer conveying method according to one exemplary embodiment of the disclosure.

As shown in FIG. 9 to FIG. 11, the discloser has found, during the research process, that a lifting rod 3 is required to jack up a wafer 100 after completing the processing of the wafer 100, and after the wafer 100 is jacked up, the wafer 100 is taken out from a reaction chamber by a mechanical arm, and then the lifting rod 3 will descend by its own weight. However, since an electrostatic adsorption force exists between a bottom surface of the wafer 100 and the lifting rod 3, the lifting rod 3 is usually adhered to the bottom surface of the wafer 100 without falling. When the mechanical arm takes out the wafer 100, the lifting rod 3 is dragged by the wafer 100 and thus stuck obliquely, namely, the lifting rod 3 gets stuck. However, this condition cannot be monitored in the current device. When entering the reaction chamber, the next wafer 100' will collide with the oblique lifting rod 3, so damage to the lifting rod 3 is caused, and the wafer 100' may be damaged.

Figure 2:
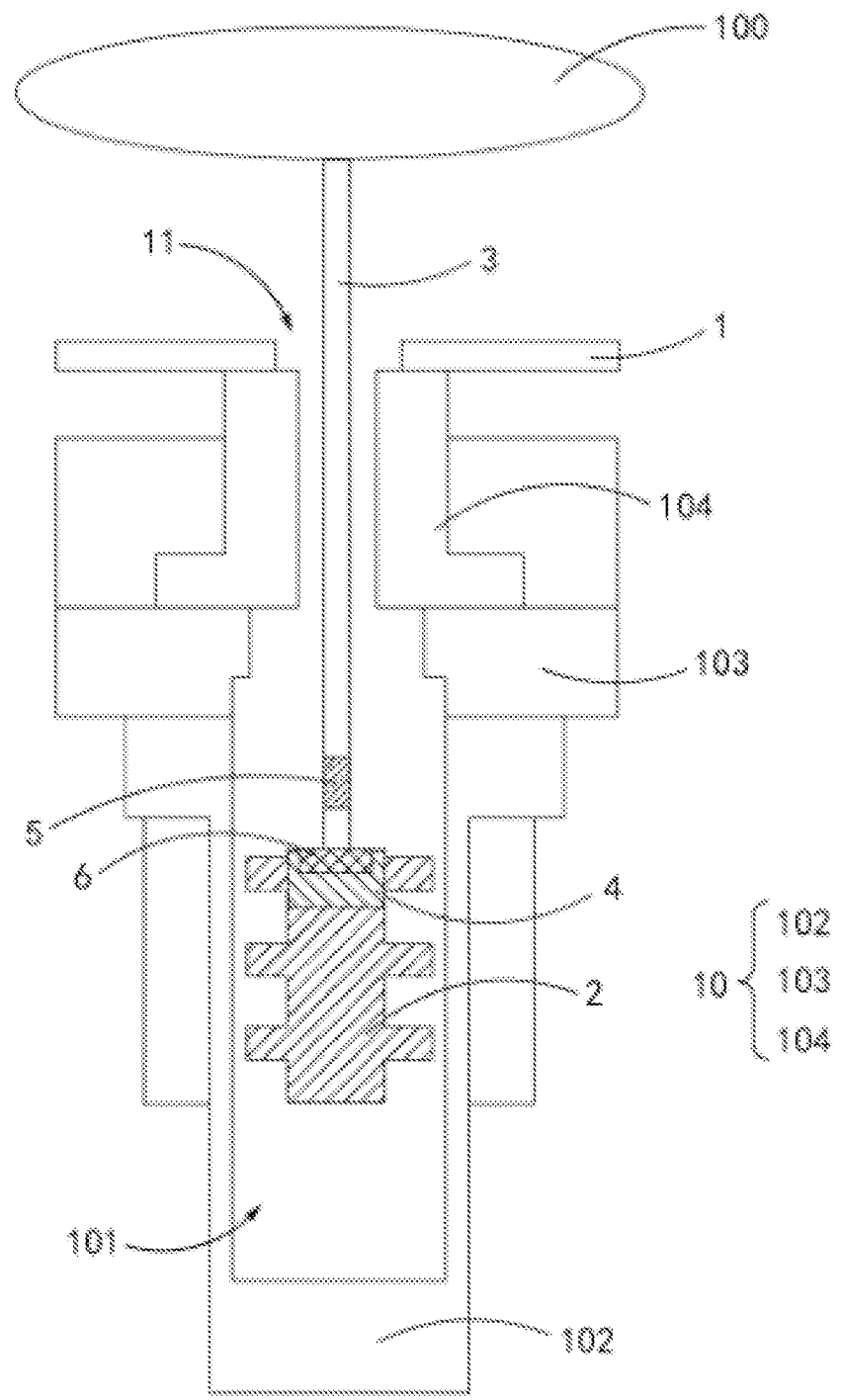
FIG. 2 is a schematic diagram illustrating that a wafer is jacked up by a lifting rod in a wafer processing device according to one exemplary embodiment of the disclosure.
Figure 3:
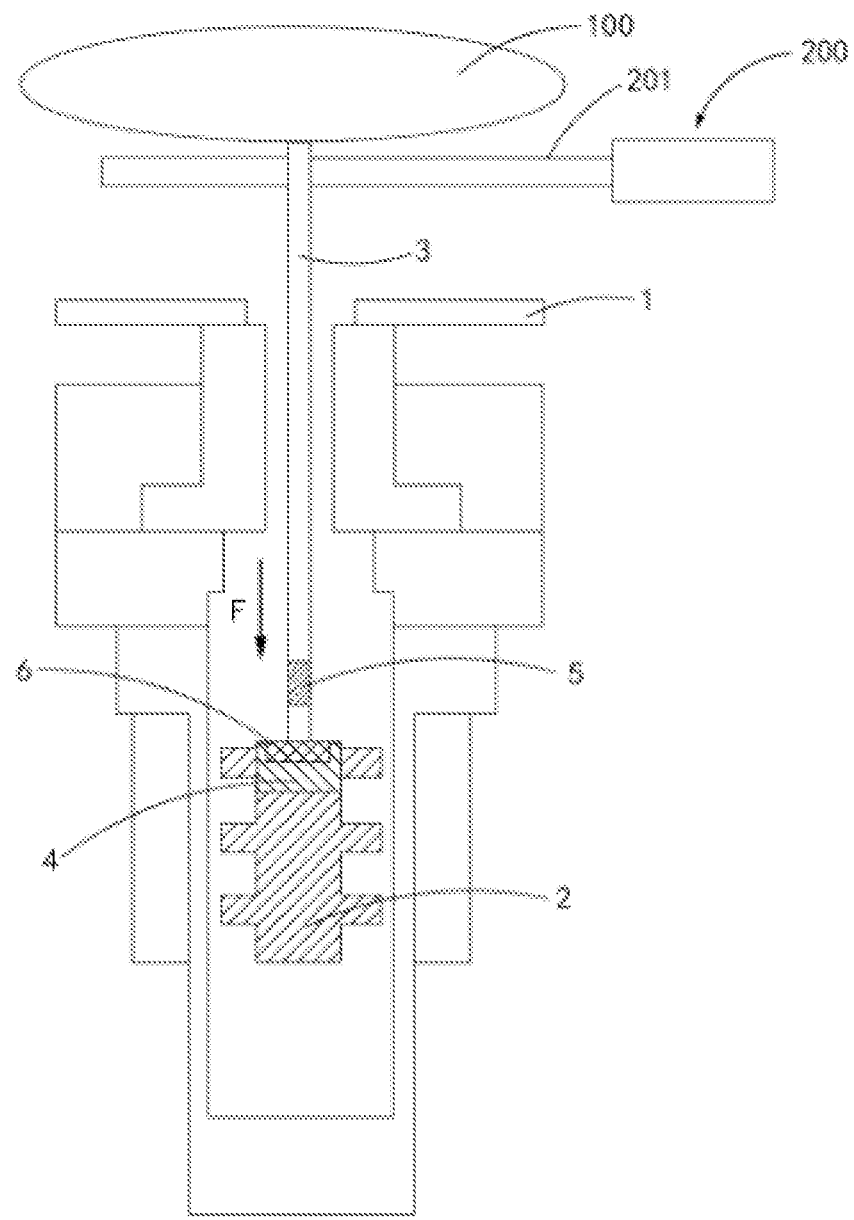
FIG. 3 is a schematic diagram illustrating that a lifting rod is magnetically attracted at a bottom surface of a wafer in a wafer processing device according to one exemplary embodiment of the disclosure.
Figure 4:
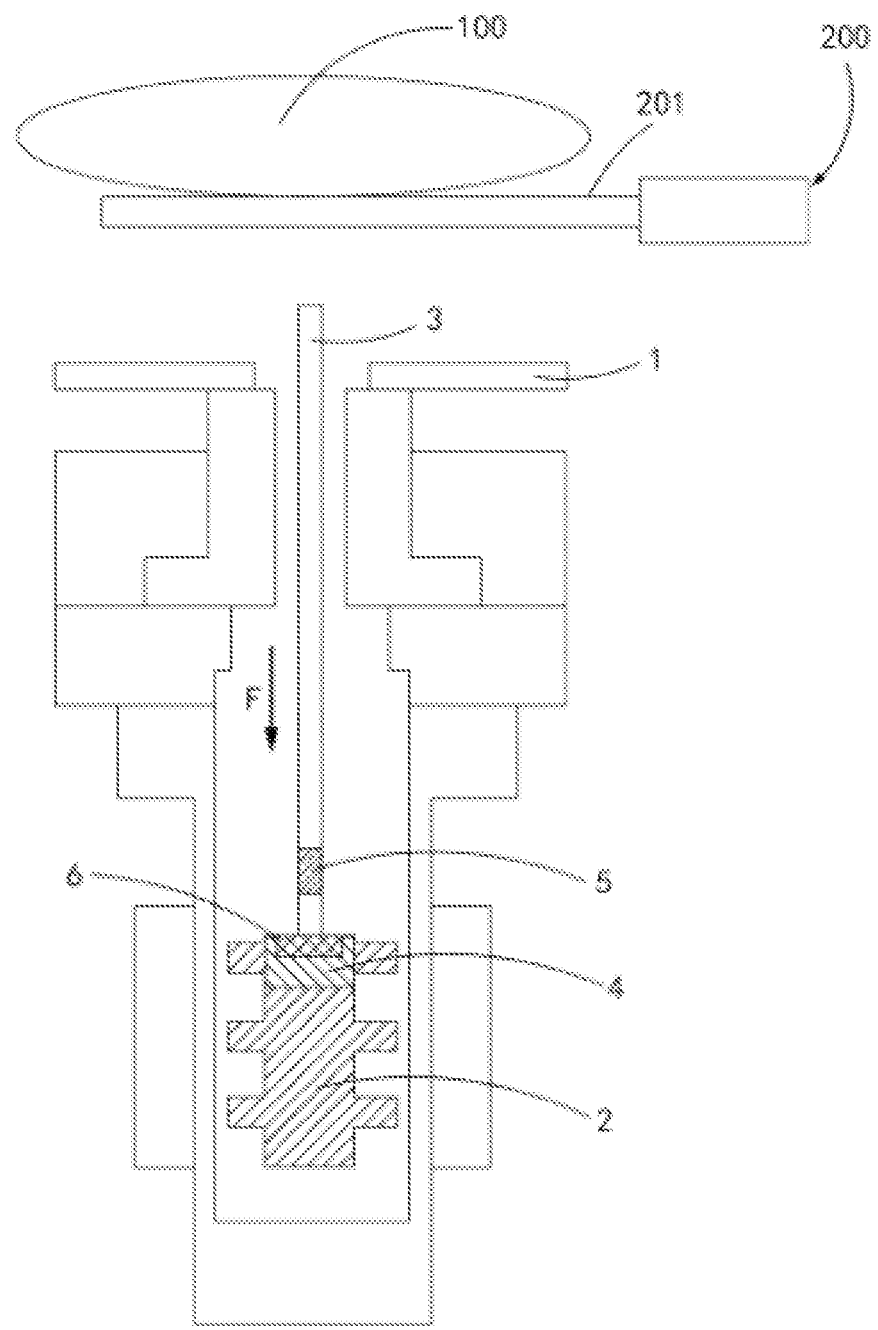
FIG. 4 is a schematic diagram illustrating that a lifting rod is separated from a wafer under pulling force in a wafer processing device according to one exemplary embodiment of the disclosure.
Figure 5:
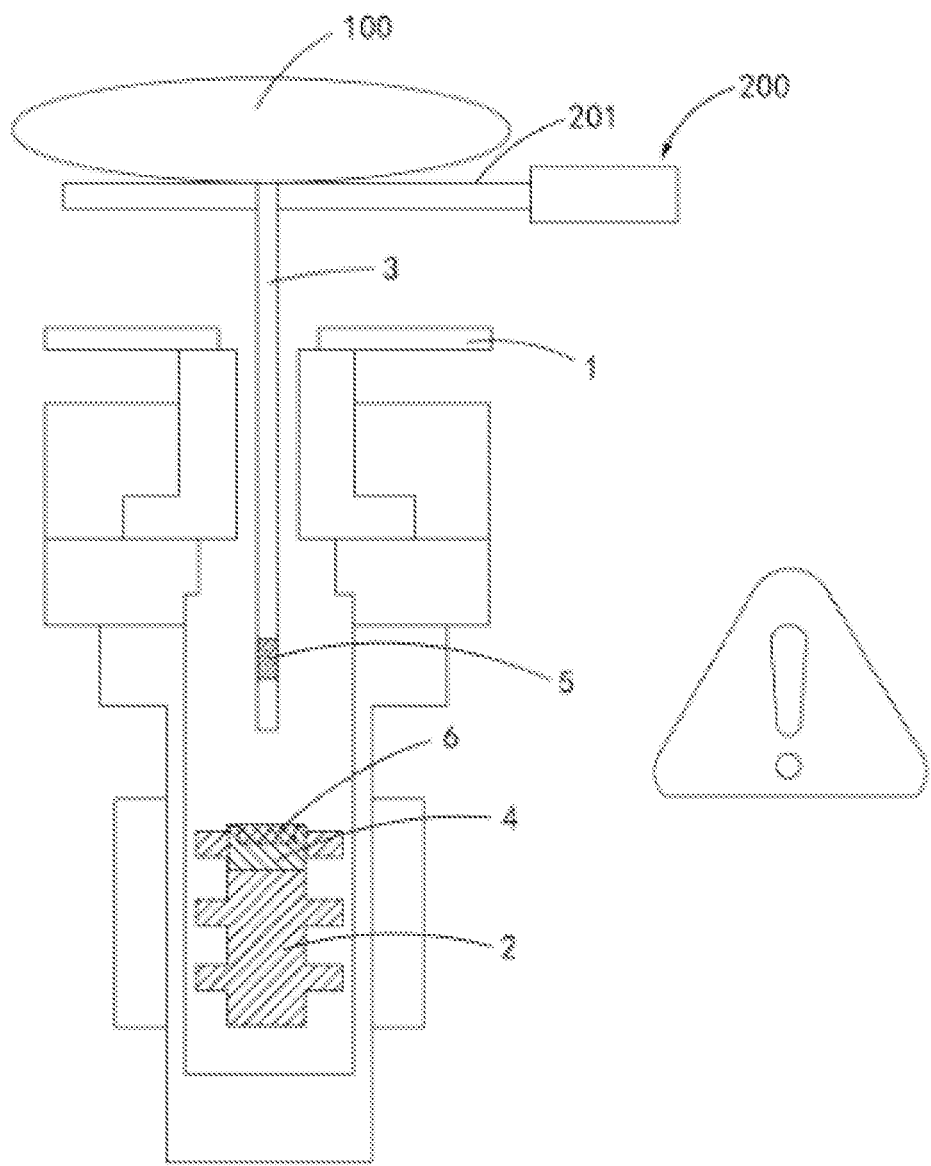
FIG. 5 is an schematic diagram illustrating that a wafer processing device alarms when a pulling force of a lifting rod is greater than or equal to a preset force according to one exemplary embodiment of the disclosure.

In order to solve the above problem, embodiments of the disclosure provide a wafer processing device. Referring to FIG. 1 to FIG. 5, which respectively show structural schematic diagrams of a wafer processing device in different states. Herein, FIG. 1 shows a schematic diagram illustrating that a lifting rod 3 is not lifted up in a wafer processing device, FIG. 2 shows a schematic diagram illustrating that a wafer is jacked up by a lifting rod 3 in a wafer processing device, FIG. 3 shows a schematic diagram illustrating that a lifting rod 3 is magnetically attracted at a bottom surface of a wafer 100 in a wafer processing device, FIG. 4 shows a schematic diagram illustrating that a lifting rod 3 is separated from a wafer 100 under a pulling force F in a wafer processing device, and FIG. 5 shows an schematic diagram illustrating that a wafer processing device alarms when the pulling force F of a lifting rod 3 is greater than or equal to a preset force.

As shown in FIG. 1 to FIG. 5, embodiments of the disclosure provide a wafer processing device, which includes a bearing plate 1, a drive base 2, a lifting rod 3, an electromagnetic conversion device 4 and a magnetic element 5. Herein, a through hole 11 is formed in the bearing plate 1, and configured to bear a wafer 100. The drive base 2 may be liftable relative to the bearing plate 1. The lifting rod 3 is arranged between the bearing plate 1 and the drive base 2, an end of the lifting rod 3 is in contact with the drive base 2, and the drive base 2 drives the lifting rod 3 to ascend and descend in the through hole, so that an another end of the lifting rod 3 acts on the bottom surface of the wafer 100 through the through hole 11 to separate the wafer 100 from the bearing plate. The electromagnetic conversion device 4 is arranged on the drive base 2, and the electromagnetic conversion device 4 may generate magnetic force after being powered on. The magnetic element 5 is arranged at an end, close to the drive base 2, of the lifting rod 3. After the electromagnetic conversion device 4 generates the magnetic force, the electromagnetic conversion device 4 magnetically attracts the magnetic element 5, and when the drive base 2 descends, a pulling force F is applied to the lifting rod 3.

It needs to be noted that "ascend" and "descend" in the embodiments of the disclosure are used to describe the relative movement of components in the wafer 100 processing device. Taking the bearing plate 1 as a reference, when the lifting rod 3 and/or the drive base 2 move towards a direction close to the wafer 100, the lifting rod 3 and/or the drive base 2 ascend, and when the lifting rod 3 and/or the drive base move towards a direction away from the wafer 100, the lifting rod 3 and/or the drive base descend. It is understood that the drive base 2 is located below the wafer 100. Therefore, the movement of the drive base 2 close to the wafer 100 is ascending. Description herein is only used to explain the above technical terms, and does not have a limiting sense.

Since the electromagnetic conversion device 4 and the magnetic element 5 are provided in the wafer processing device, and the electromagnetic conversion device 4 will generate magnetic force after being powered on, to attract the magnetic element 5, and further to generate a pulling force F on the lifting rod 3, the lifting rod 3 is forced to be separated from the wafer 100 by the pulling force F after the lifting rod 3 jacks up the wafer 100, thereby avoiding the condition that the lifting rod 3 gets stuck due to inclination, and then avoiding the damage to the lifting rod 3 and the next wafer 100 to be processed.

The wafer processing device of the embodiments of the disclosure is described in details below.

The wafer processing device according to the embodiments of the disclosure includes a shell (not shown in the figure), a reaction chamber is formed in the shell, and the processing of the wafer 100 is completed in the reaction chamber. The shell further includes a worktable, which may be rotary worktable or a fixed worktable. The worktable is configured to adsorb the wafer 100. During processing, the wafer 100 may be placed on the upper surface of the worktable by a mechanical arm. A plurality of uniformly distributed air holes or air grooves may be provided in the worktable, and the wafer 100 is vacuum magnetically attracted by the uniformly distributed air holes or air grooves, so that fragments caused by slipping of the wafer 100 can be avoided. The abovementioned worktable may be the bearing plate 1 in the embodiments of the disclosure.

As shown in FIG. 1, a through hole 11 is formed in a center of the bearing plate 1, and a diameter of the through hole 11 is greater than an outer diameter of the lifting rod 3, to avoid damaging of the lifting rod 3 due to friction with the through hole of the bearing plate 1.

As shown in FIG. 2, the wafer processing device according to the embodiments of the disclosure further includes a drive part 10, a drive cavity 101 is disposed in the drive part 10, and the bearing plate 1 is arranged on the drive part 10 and located above the drive cavity 101. The drive base 2, the lifting rod 3, the electromagnetic conversion device 4 and the magnetic element 5 are all arranged in the drive cavity 101. An opening of the drive cavity 101 communicates with the through hole 11 of the bearing plate 1, so that the lifting rod 3 can extend from the drive cavity 101 into the through hole 11 of the bearing plate 1. Specifically, as shown in FIG. 2, the drive part 10 may include: a lifting tube 102, a mounting table 103 and a fixed pin 104, which are coaxially installed from bottom to top, and the lifting tube 102, the mounting table 103 and the fixed pin 104 are hollow structures. Inner diameters of the hollow parts of the lifting tube 102, the mounting table 103 and the fixed pin 104 are successively reduced, namely, the inner diameter of the fixed pin 104 is minimum. However, the minimum inner diameter is greater than the diameter of the lifting rod 3, so as to avoid the damage of the lifting rod 3 due to friction with the inner wall of the drive cavity 101. The bearing plate 1 is arranged at the top end of the fixed pin 104.

Specifically, the bearing plate 1 may rotate relative to the drive part 10, for example, the bearing plate 1 is installed above the fixed pin 104. The bearing plate 1 may be also fixedly connected to the top end of the fixed pin 104, and the bearing plate 1 and the fixed part can rotate at the same time. The bearing plate 1 may be also non-rotary. Those skilled in the art may set according to actual conditions, and special limitations are not made herein. The wafer 100 is placed on the bearing plate 1 for processing, and the position, where the bearing surface of the bearing plate 1 is located, is called as a first position.

Further, referring to FIG. 1 to FIG. 5, the drive base 2 can perform lifting movement in the drive cavity 101. The drive base 2 is connected to a drive device, and the drive device provides power to the drive base 2, so as to promote the drive base 2 to perform lifting movement. The drive device may be, for example, a hydraulic system, a pneumatic system or a magnetic system, namely, the lifting movement of the drive base 2 can be controlled by controlling the drive device, and special limitations are not made herein.

The drive base 2 mainly provides power for the ascent of the lifting rod 3. Further, referring to FIG. 1, the lifting rod 3 is arranged in the drive cavity 101. When not ascending, one end of the lifting rod 3 is in contact with the drive base 2, the other end of the lifting rod may be arranged in the drive cavity 101. The other end of the lifting rod may also extend out of the drive cavity 101. An end face of the other end may be flush with the upper surface of the bearing plate 1, so as to abut against the wafer 100. FIG. 1 to FIG. 5 are only schematic diagrams. Actually, an end, close to the drive base 2, of the lifting rod 3 may be provided with a supporting table, so that the lifting rod 3 can keep vertical in the drive cavity 101. Since those skilled in the art can know the supporting table clearly, the supporting table is not shown for simplifying the figures. The number of the lifting rod 3 may be one, two, three, four, five or six, which can be set by those skilled in the art according to actual demands, and is not specially limited herein. However, the number of the through holes 11 in the bearing plate 1 needs to be the same as the number of the lifting rods 3, and through holes needs to correspond to the lifting rods one to one. If there are a plurality of lifting rods 3, the lifting rods 3 preferably may be symmetrically arranged. In one embodiment of the disclosure, there is provided one lifting rod 3, which implements the jacking-up effect of the wafer 100, while simplifying the device structure and the manufacturing process.

Figure 6:
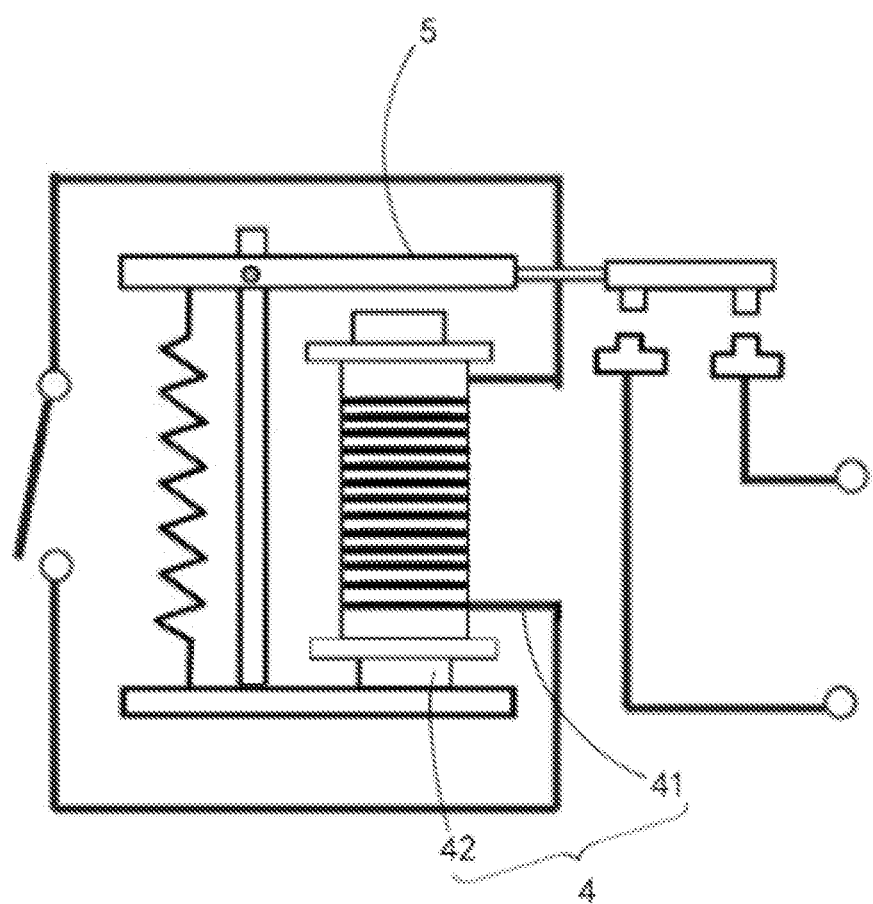
FIG. 6 is a schematic diagram of an electromagnetic conversion device in a wafer device according to one exemplary embodiment of the disclosure.

Continuing to refer to FIG. 1 to FIG. 5, the electromagnetic conversion device 4 is arranged on the drive base 2. The electromagnetic conversion device 4 generates magnetic force after being powered on. The magnitude of magnetic force may be controlled by controlling the magnitude of current. The electromagnetic conversion device 4 may be an electromagnetic converter. As shown in FIG. 6, the electromagnetic converter is mainly composed of an inductance coil 41 and a metal bar 42. Currents in different directions are supplied to the inductance coil 41, the electromagnetic converter generates different directions of magnetic forces. In embodiments of the disclosure, it is necessary to generate a downward pulling force F on the lifting rod 3. Therefore, the current in the corresponding direction needs to be supplied. When the current is cut off, the magnetic force disappears.

As shown in FIG. 1, the magnetic element 5 is arranged at an end part of one end, close to the drive base 2, of the lifting rod 3. The material of the magnetic element 5 may be silicon steel, stainless steel or other high temperature resistant alloy. When electromagnetic conversion device 4 generates magnetic force, the electromagnetic conversion device 4 and the magnetic element 5 can attract each other. The lifting rod 3 is arranged above the drive base 2, so the electromagnetic conversion device 4 may generate downward pulling force F on the lifting rod 3. When the other end of the lifting rod 3 is magnetically attracted at the bottom surface of the wafer 100 due to electrostatic adsorption force, the lifting rod may be separated from the wafer 100 by the pulling force F, and then falls by its own weight, thereby avoiding the condition that the lifting rod 3 cannot fall freely when being stuck due to inclination. When the lifting rod 3 is separated from the wafer 100, the pulling force F is the electrostatic adsorption force minus the weight of the lifting rod 3.

Figure 8:
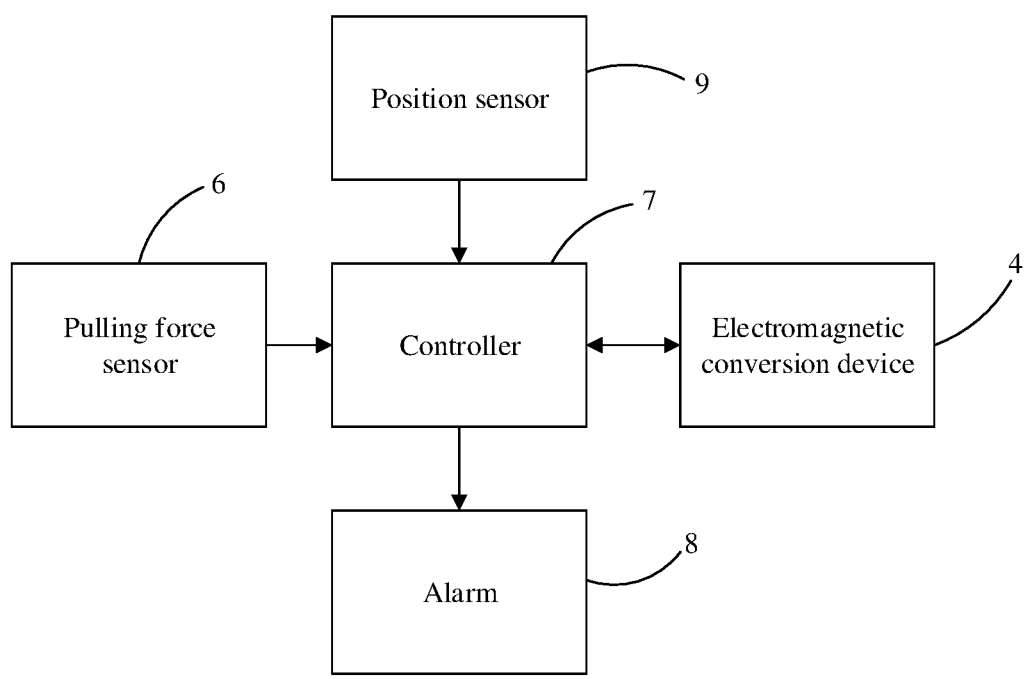
FIG. 8 is a functional block diagram of a wafer device according to one exemplary embodiment of the disclosure.

As shown in FIG. 8, the wafer processing device according to one embodiment of the disclosure further includes a controller 7. The controller 7 is electrically connected to the drive base 2 and the electromagnetic conversion device 4. When the drive base 2 drives the lifting rod 3 to descend to a preset position, the electromagnetic conversion device 4 is controlled to be powered on so as to generate pulling force on the lifting rod 3.

However, the electrostatic adsorption force between the lifting rod 3 and the wafer 100 is sometimes great, so a greater pulling force F is needed to separate the lifting rod 3 from the wafer 100. The greater pulling force F may generate damage to the wafer 100. In order to avoid the condition, the wafer processing device according to the embodiment of the disclosure further includes a pulling force sensor 6. The pulling force sensor 6 is electrically connected to the controller 7, to sense the pulling force F experienced by the lifting rod 3. Specifically, the pulling force sensor 6 may be arranged on the drive base 2, and the pulling force sensor is a diaphragm type pressure sensor, which is in contact with a bottom end of the lifting rod 3. When the electromagnetic conversion device 4 is powered on, a magnetic force generates between the electromagnetic conversion device 4 and the magnetic element 5 and thus the bottom end of the lifting rod 3 is magnetically attracted. In this case, the lifting rod 3 is subjected to a downward pulling force, which can be detected by the pulling force sensor.

A preset force value may be set, and the preset force value may be the maximum force that the wafer 100 can withstand without being damaged. For example, the preset force value may be 5-10 times of the weight of the lifting rod 3, specifically, the preset force value may be 5 times, 6 times, 7 times, 8 times, 9 times or 10 times of the weight of the lifting rod, and the special value of the preset force value may be 4N, 4.5N, 5N. Certainly, those skilled in the art may set the force value according to the actual condition, and special limitations are not made herein. When the pulling force sensor detects that the pulling force F experienced by the lifting rod 3 is greater than the preset force value, an early warning signal is sent to the controller 7. After receiving the early warning signal, the controller 7 controls the electromagnetic conversion device 4 to be powered off, so that the magnetic force disappears, and then the pulling force F is released, thereby avoiding the damage to the wafer 100 caused by excessive pressure. Since the lifting rod 3 is not separated from the wafer 100, the input of the next wafer 100 may be suspended.

Figure 7:
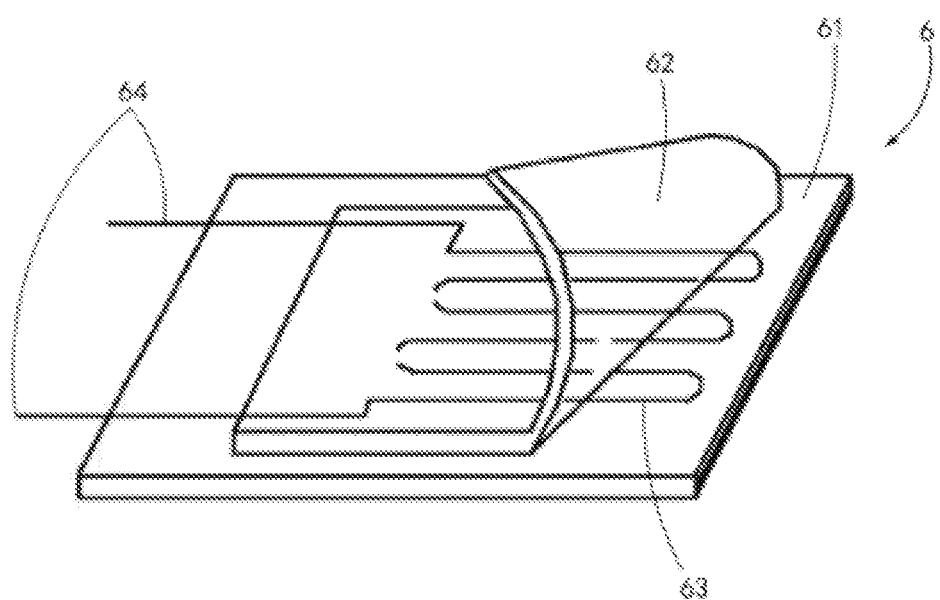
FIG. 7 is a schematic diagram of a pulling force sensor in a wafer device according to one exemplary embodiment of the disclosure.

In one embodiment, as shown in FIG. 7, the pulling force sensor 6 is a piezoresistive sensor. The piezoresistive sensor includes a substrate 61, a covering layer 62, a resistance wire sensitive grid 62 and a lead 64. Herein, the resistance wire sensitive grid 63 is arranged between the covering layer 62 and the substrate 61. The resistance wire sensitive grid 63 is a strain resistance sensitive grid, and its working principle is that: the resistance of the resistance wire sensitive grid is changed when the resistance wire sensitive grid senses the changed action force on the covering layer 62, and then the current signal is controlled to be changed, so that the pressure change is converted into an electrical signal for output. With sensitive reaction and high detection precision, the piezoresistive sensor can effectively prevent the lifting rod 3 from being damaged. The range of the pressure sensor is 0-5N, and specifically may be 1N, 2N, 3N or 4N. Those skilled in the art may set the range according to the actual conditions, for example, according to the force capable of being born by the wafer 100. Special limitations are not made herein. In addition, when processing the wafer 100, the reaction chamber is usually vacuumized and in a high temperature environment. Therefore, the pulling force sensor 6 may be made of the high temperature resistant material. For example, the material of the pulling force sensor 6 may be alloy or the sleeve of the pulling force sensor 6 includes quartz, or other high temperature resistant materials, such as materials resistant to high temperatures up to 1200° C.

The wafer processing device according to one embodiment of the disclosure further includes an alarm 8, which is electrically connected to the controller 7. When the electromagnetic conversion device 4 is powered off, the controller 7 controls the alarm 8 to alarm. Although the lifting rod 3 is not separated from the wafer 100, because of the alarm response of the alarm 8, an operator will pay attention to the fault of the device and perform an adjustment in time, to avoid the damage to the lifting rod 3 and to the wafer 100.

As shown in FIG. 3 and FIG. 8, the wafer processing device according to one embodiment of the disclosure further includes an output mechanism 200 and a position sensor 9. Herein, the output mechanism 200 is configured to bear and output the processed wafer 100. The output mechanism 200 may be the abovementioned mechanical arm, which has a bearing surface 201. The position of the bearing surface 201 is the abovementioned preset position. After being processed, the wafer 100 is jacked up by the lifting rod 3 and is placed on the bearing surface 201, and then conveyed out of the reaction chamber. The position sensor 9 is arranged on the lifting rod 3, electrically connected to the controller 7, and configured to sense whether the lifting rod 3 is separated from the wafer 100 or not when the lifting rod 3 jacks up the wafer 100 and places the wafer 100 on the bearing surface 201 of the output mechanism 200, namely, when the bottom surface of the wafer 100 is in contact with the bearing surface 201 of the mechanical arm. In other words, when the lifting rod 3 jacks up the wafer 100 and places the wafer 100 on the mechanical arm, the position sensor 9 senses whether the top end of the lifting rod 3 is in contact with the bottom surface of the wafer 100 or not. When the position sensor 9 senses that the lifting rod 3 is in contact with the bottom surface of the wafer 100, the position sensor 9 sends out a starting signal to the controller 7. Responsive to receiving the starting signal, the controller 7 controls the electromagnetic conversion device 4 to start, to generate the magnetic force, and then the pulling force F is generated on the lifting rod 3. Moreover, the pulling force F is continuously increased by increasing current, until the position sensor 9 senses that the lifting rod 3 is separated from the bottom surface of the wafer 100, and then an early warning signal is sent to the controller 7. Responsive to receiving the early warning signal, the controller 7 controls the electromagnetic conversion device 4 to be powered off, and then the magnetic force disappears. When the pulling force sensor 6 senses that the pulling force F of the lifting rod 3 is greater than the preset force value, even if the position sensor 9 does not detect that the lifting rod 3 is separated from the bottom surface of the wafer 100, the controller 7 also controls the electromagnetic conversion device 4 to be powered off, so that the magnetic force disappears.

The position sensor 9 is provided so that it can accurately judge whether the lifting rod 3 is magnetically attracted on the bottom surface of the wafer 100 or not. Moreover, after the electromagnetic conversion device 4 generates the magnetic force, if the lifting rod is separated from the wafer 100 when the pulling force is less than the preset force value, the position sensor can power off the electromagnetic conversion device 4 in time. Therefore, in the disclosure, in any one of the two conditions that the pulling force sensor 6 detects that the pulling force is greater than the preset force value and the position sensor 9 senses that the lifting rod 3 is separated from the bottom surface of the wafer 100, the controller 7 controls the electromagnetic conversion device 4 to be powered off, so that energy consumption is saved, and the operation is more accurate.

After the lifting rod 3 is separated from the bottom surface of the wafer 100, the lifting rod 3 falls in the drive cavity 101 by its own weight, and one end (which may be the supporting table) of the lifting rod 3 is in contact with the drive base 2. When the lifting rod 3 is separated from the bottom surface of the wafer 100, the electromagnetic conversion device 4 is powered off, so that the energy consumption is saved. After the pulling force F disappears, the lifting rod 3 falls only by its own weight, so the colliding force of the lifting rod 3 with the drive base 2 is reduced maximally, thereby effectively protecting the lifting rod 3.

Certainly, the position sensor 9 may be also made of high temperature material, such as, silicon steel, stainless steel. The position sensor 9 may be arranged at the top end (the other end) of the lifting rod 3 and is in contact with the bottom surface of the wafer 100. Preferably, since the processed wafer 100 may be arranged on the bearing surface 201 of the output mechanism 200, and the height of the bearing surface 201 is a fixed position, the position sensor 9 may arranged at any position of the lifting rod 3, as long as a distance value between the position sensor 9 and the bearing surface 201 is determined. Once this value is changed, it indicates that the lifting rod 3 is separated from the wafer 100. In this case, the position sensor 9 may be a distance sensor, this arrangement manner is more flexible, the sensing is more accurate, and meanwhile, the damage to the wafer 100 caused by the contact of the position sensor 9 with the bottom surface of the wafer 100 is avoided.

The wafer processing device according to one embodiment of the disclosure further includes a polishing device, a supporting device, a transmission device and a cleaning device, etc. Herein, the polishing device is configured to grind the wafer 100, so that the wafer 100 is smoother. The supporting device is configured to support the bearing plate 1, and the transmission device is configured to input and output the wafer 100 and includes a mechanical arm. The cleaning device is mainly configured to clean the processed wafer 100 to remove stains on the surface of the wafer. The abovementioned devices exist in the wafer processing device in the related art, and those skilled in the art may learn and know the purpose thereof. Details are not made in the specification.

In conclusion, since the wafer processing device is provided with the electromagnetic conversion device 4 and the magnetic element 5, magnetic force will be generated after the electromagnetic conversion device is powered on, to attract the magnetic element 5, and further to generate pulling force F on the lifting rod 3, so that after the lifting rod 3 jacks up the wafer 100, the lifting rod 3 is forced to be separated from the wafer 100 by the pulling force F, thereby avoiding the condition that the lifting rod 3 gets stuck due to inclination, and then avoiding the condition of damaging the lifting rod 3 and the next wafer 100 to be processed. In addition, since the pulling force sensor 6 is provided, when the pulling force sensor 6 detects that the pulling force F applied to the lifting rod 3 is greater than or equal to the preset force value, the electromagnetic device is controlled to be powered off, the magnetic force disappears, and then the pulling force F is released, so the damage to the wafer 100 caused by excessive pulling force F is avoided.

Another embodiment of the disclosure further provides a wafer conveying method for conveying a wafer 100 processed by the wafer processing device described in any one of the abovementioned embodiments. The method includes the following steps.

At S100, the wafer 100 is placed on a bearing plate 1.

At S200, a drive base 2 drives a lifting rod 3 to act on a bottom surface of the wafer 100, to place the wafer 100 at a preset position.

At S300, a pulling force is applied to the lifting rod 3, to separate the lifting rod 3 from the bottom surface of the wafer 100.

Herein, S200 includes the following steps.

At S201, the lifting rod 3 is controlled to drive the wafer 100 to ascend from a first position to a second position.

At S202, an output mechanism is placed at the preset position.

At S203, the lifting rod is controlled to drive the wafer to descend from the second position to the preset position.

Herein, the first position specifically refers to the bearing surface of the bearing plate 1, namely, the position of the wafer 100 during processing, and the first position is the lowest position. The second position refers to the highest position of the wafer 100 jacked up by the lifting rod 3. The preset position is located between the first position and the second position, and is the position of the bearing surface 201 of the output mechanism 200. The wafer 100 ascends to the second position from the first position, so that the bearing surface of the output mechanism 200 is placed at the preset position, and then the wafer 100 descends to the preset position, namely, the wafer 100 is placed on the bearing surface 201, so that the output mechanism 200 outputs the processed wafer 100 from the reaction chamber.

Herein, S300 includes the following steps.

At S301, the drive base 2 is controlled to descend.

At S302, the electromagnetic conversion device 4 on the drive base 2 is powered on to generate magnetic force, so as to adsorb the magnetic element 5 provided on the lifting rod 3 and generate pulling force on the lifting rod 3.

Specifically, when the wafer 100 is arranged on the bearing surface 201 of the output mechanism 200, the drive base 2 may be controlled to descend by the controller 7. At the same time, the electromagnetic conversion device 4 on the drive base 2 is powered on to generate magnetic force, so as to adsorb the magnetic element provided on the lifting rod 3, so that pulling force is applied to the lifting rod 3, thereby forcing the lifting rod 3 to generate a downward movement trend.

The wafer conveying method according to one embodiment of the disclosure further includes the following steps.

At S400, the pulling force generated by the lifting rod 3 is sensed, and when the pulling force is greater than the preset force value, the electromagnetic conversion device is controlled to be powered off.

Namely, the pulling force experienced by the lifting rod 3 is sensed by the pulling force sensor 6. A preset force value is set in the pulling force sensor 6. When the pulling force sensor senses that the pulling force is greater than the preset force value, an early warning signal is sent to the controller 7, and the controller 7 controls the electromagnetic conversion device 4 to be powered off.

The wafer processing device according to one embodiment of the disclosure further includes an alarm 8. After the above controller 7 controls the electromagnetic conversion device 4 to be powered off, the alarm 8 may be controlled to alarm, so as to inform workers of a fault. Therefore, the method provided by the embodiments of the disclosure can avoid the damage to the lifting rod 3 and the wafer 100 during a conveying process.

Other structures in the wafer processing device have been described in details in other embodiments, and the specific structures and functions are not described herein.

It should be understood that the disclosure does not limit its application to the detailed structure and arrangement of the components presented in the specification. The disclosure can have other implementation modes and can be implemented and executed in a variety of modes. The abovementioned forms of deformation and modification fall within the scope of the disclosure. It should be understood that the disclosure disclosed and limited by the specification extends to all alternative combinations of two or more separate features mentioned or apparent in the text and/or drawings. All of these different combinations constitute a plurality of alternative aspects of the disclosure. The implementation mode of this specification illustrates the best known mode to implement the disclosure and will enable those skilled in the art to make use of the disclosure.

The invention claimed is:

1. A wafer processing device, comprising:
  a bearing plate, wherein a through hole is formed in the bearing plate, and the bearing plate is configured to bear a wafer;
  a drive base liftable relative to the bearing plate;
  a lifting rod arranged between the bearing plate and the drive base, wherein an end of the lifting rod is in contact with the drive base, and the drive base drives the lifting rod to ascend and descend in the through hole, so that an another end of the lifting rod acts on a bottom surface of the wafer through the through hole, to separate the wafer from the bearing plate;
  an electromagnetic conversion device arranged on the drive base, wherein the electromagnetic conversion device generates a magnetic force after being powered on;
  a magnetic element arranged at an end, close to the drive base, of the lifting rod, wherein after the electromagnetic conversion device generates the magnetic force, the electromagnetic conversion device magnetically attracts the magnetic element, and when the drive base descends, a pulling force is applied to the lifting rod; and
  a drive part provided with a drive cavity, wherein the bearing plate is arranged on the drive part and located above the drive cavity, and the drive base, the lifting rod, the electromagnetic conversion device and the magnetic element are all arranged in the drive cavity; and, wherein the drive part comprises a lifting tube, a mounting table and a fixed pin which are coaxially installed from bottom to top, and the lifting tube, the mounting table and the fixed pin are all hollow structures.

2. The wafer processing device of claim 1, wherein the material of the magnetic element is silicon steel or stainless steel.

3. The wafer processing device of claim 1, further comprising a controller, electrically connected to the drive base and to the electromagnetic conversion device, wherein when the drive base drives the lifting rod to descend to a preset position, the controller controls the electromagnetic conversion device to be powered on so as to generate a pulling force on the lifting rod.

4. The wafer processing device of claim 3, further comprising:
a pulling force sensor, electrically connected to the controller and configured to sense the pulling force experienced by the lifting rod.

5. The wafer processing device of claim 4, wherein the pulling force sensor is arranged on the drive base and is in contact with a bottom end of the lifting rod.

6. The wafer processing device of claim 4, wherein the pulling force sensor is a piezoresistive sensor.

7. The wafer processing device of claim 4, wherein the pulling force sensor is provided with a preset force value, and when the pulling force sensor senses that the pulling force is greater than the preset force value, an early warning signal is sent to the controller, and then the controller controls the electromagnetic conversion device to be powered off.

8. The wafer processing device of claim 7, further comprising an alarm electrically connected to the controller, wherein the controller controls the alarm to alarm responsive to the controller receiving the early warning signal sent by the pulling force sensor.

9. The wafer processing device of claim 8, further comprising:
an output mechanism, located in a same level as the preset position and configured to bear and output the wafer separated from the bearing plate at the preset position; and a position sensor, arranged on the lifting rod, electrically connected to the controller, and configured to sense whether the lifting rod is separated from the bottom surface of the wafer or not when the lifting rod acts on the wafer and the wafer is placed on the output mechanism;
wherein when the position sensor senses that the another end of the lifting rod is magnetically attracted on the bottom surface of the wafer, the controller controls the electromagnetic conversion device to be powered on and controls the magnetic force to be gradually increased, so that the pulling force experienced by the lifting rod is gradually increased, until the controller controls the electromagnetic conversion device to be powered off responsive to the position sensor senses that the lifting rod is separated from the wafer.

10. The wafer processing device of claim 9, wherein the position sensor is arranged at a top end of the lifting rod.

11. The wafer processing device of claim 9, wherein the position sensor is a distance sensor.

12. The wafer processing device of claim 7, wherein the preset force value is 5-10 times of the weight of the lifting rod.

13. A wafer conveying method for conveying a wafer processed by a wafer processing device, the wafer processing device comprising a bearing plate, wherein a through hole is formed in the bearing plate, and the bearing plate is configured to bear a wafer;
a drive base liftable relative to the bearing plate;
a lifting rod arranged between the bearing plate and the drive base, wherein an end of the lifting rod is in contact with the drive base, and the drive base drives the lifting rod to ascend and descend in the through hole, so that an another end of the lifting rod acts on a bottom surface of the wafer through the through hole, to separate the wafer from the bearing plate;
an electromagnetic conversion device arranged on the drive base, wherein the electromagnetic conversion device generates a magnetic force after being powered on;
a magnetic element arranged at an end, close to the drive base, of the lifting rod, wherein after the electromagnetic conversion device generates the magnetic force, the electromagnetic conversion device magnetically attracts the magnetic element, and when the drive base descends, a pulling force is applied to the lifting rod;
a drive part provided with a drive cavity, wherein the bearing plate is arranged on the drive part and located above the drive cavity, and the drive base, the lifting rod, the electromagnetic conversion device and the magnetic element are all arranged in the drive cavity;
wherein the drive part comprises a lifting tube, a mounting table and a fixed pin which are coaxially installed from bottom to top, and the lifting tube, the mounting table and the fixed pin are all hollow structures,
the wafer conveying method comprising:
placing the wafer on the bearing plate;
driving the lifting rod to act on a bottom surface of the wafer by the drive base, to place the wafer at a preset position; and
applying a pulling force to the lifting rod, to separate the lifting rod from the bottom surface of the wafer.

14. The wafer conveying method of claim 13, wherein said applying the pulling force to the lifting rod, to separate the lifting rod from the bottom surface of the wafer comprises:
controlling the lifting rod to drive the wafer to ascend from a first position to a second position;
placing an output mechanism at the preset position; and
controlling the lifting rod to drive the wafer to descend from the second position to the preset position.

15. The wafer conveying method of claim 14, wherein the preset position is provided between the first position and the second position.

16. The wafer conveying method of claim 14, wherein the first position is a bearing surface of the bearing plate, and the second position is a highest position of the wafer jacked up by the lifting rod.

17. The wafer conveying method of claim 13, wherein said applying the pulling force to the lifting rod, to separate the lifting rod from the bottom surface of the wafer comprises:
controlling the drive base to descend; and
powering on the electromagnetic conversion device on the drive base to generate a magnetic force, so as to magnetically attract the magnetic element arranged on the lifting rod and thus to generate the pulling force on the lifting rod.

18. The wafer conveying method of claim 17, further comprising:

sensing the pulling force experienced by the lifting rod, and controlling the electromagnetic conversion device to be powered off when the pulling force is greater than the preset force value.

* * * * *